United States Patent [19]

Suzuki et al.

[11] Patent Number: 5,225,683
[45] Date of Patent: Jul. 6, 1993

[54] DETACHABLE SPECIMEN HOLDER FOR TRANSMISSION ELECTRON MICROSCOPE

[75] Inventors: Seiichi Suzuki; Toru Kasai; Kimio Ohi, all of Tokyo, Japan

[73] Assignee: Jeol Ltd., Tokyo, Japan

[21] Appl. No.: 800,587

[22] Filed: Nov. 27, 1991

[30] Foreign Application Priority Data

Nov. 30, 1990 [JP] Japan ................. 2-335788
Apr. 25, 1991 [JP] Japan ................. 3-95586

[51] Int. Cl.⁵ ............................. H01J 37/20
[52] U.S. Cl. ..................... 250/442.11; 250/311
[58] Field of Search ........... 250/442.11, 311, 310, 250/307

[56] References Cited

U.S. PATENT DOCUMENTS

| 2,421,696 | 6/1947 | Hillier | 250/442.11 |
| 3,896,314 | 7/1975 | Nukui et al. | 250/442.11 |
| 4,587,431 | 5/1986 | Uemura | 250/442.11 |
| 4,710,633 | 12/1987 | Suzuki | 250/442.11 |
| 5,089,708 | 2/1992 | Asselbergs | 250/442.11 |

Primary Examiner—Jack I. Berman
Assistant Examiner—James Beyer
Attorney, Agent, or Firm—Webb, Burden, Ziesenheim & Webb

[57] ABSTRACT

A side-entry specimen holder for use with a transmission electron microscope. The holder comprises a specimen-holding plate and an insertion rod. The holding plate is provided with a hole permitting passage of the electron beam produced inside the microscope. Either a specimen or a piece of mesh on which a specimen is placed is held inside the hole. An engaging hole is formed at one end of the holding plate. The insertion rod has a pin at its front end. The pin is engaged in the engaging hole to detachably hold the holding plate. Thus, the insertion rod is coupled to the holding plate.

9 Claims, 3 Drawing Sheets 5,225,683

DETACHABLE SPECIMEN HOLDER FOR TRANSMISSION ELECTRON MICROSCOPE

FIELD OF THE INVENTION

The present invention relates to a specimen holder for use with a transmission electron microscope and, more particularly, to a side-entry specimen holder which is inserted between the magnetic pole pieces of the objective lens of a transmission electron microscope through the side wall of the microscopic column.

BACKGROUND OF THE INVENTION

A known specimen holder for a transmission electron microscope is constructed as shown in FIGS. 7(a) and 7(b). In FIG. 7(a), the specimen holder has an insertion rod 41. A specimen-holding portion 42 is formed at the front end of the rod 41 and provided with a hole 43 permitting passage of the electron beam. A piece of mesh 44 on which a specimen S is placed is held within the hole 43 by a hold-down member 45 such as a spring or screw. The holder is held to a goniometer (not shown). The front end of the holder is inserted into the location of the optical axis O of the electron beam between the magnetic pole pieces 46 by the goniometer. In this location, the front end is irradiated with the electron beam. The goniometer is capable of moving the specimen within a plane perpendicular to the optical axis and tilting the specimen from the optical axis.

In the above-described side-entry specimen holder, the specimen-holding portion 42 may be provided with a plurality of holes permitting passage of the electron beam as shown in FIG. 7(b) to observe and compare plural specimens. However, the number of the holes is few at the most. Where more specimens are observed and compared, the specimens already observed are withdrawn from the holder, and then they are replaced with a new set of specimens. Alternatively, plural specimen holders are prepared to replace specimens.

Where the specimens are replaced after they are once detached from the holder, the detached specimens must be replaced under the same conditions as the conditions established prior to the detachment. For example, a region of a specimen which is observed at a magnification of tens of thousands must be placed at the previous azimuth angle, or at the previous angular position. This operation is impossible to achieve manually. Also, in the case of a very thin specimen, it might be installed upside down. In this way, it is difficult to reproduce the observational conditions faithfully.

Where a plurality of specimen holders are prepared, the cost of the instrument is increased. Hence, this scheme is quite uneconomical.

Furthermore, the replacement operation is extremely cumbersome to carry out, because specimens observed by transmission electron microscopy are very thin, generally less than 1 μm, for example, and because the diameter of the opening spaces in the mesh is only 3 mm. Therefore, it takes a long time for an unskilled operator to replace the specimens. In addition, there is a possibility that he or she destroys valued specimens during replacement operation.

SUMMARY OF THE INVENTION

In view of the foregoing problems with the prior art techniques, it is an object of the present invention to provide a specimen holder which is used with a transmission electron microscope and permits specimens to be replaced easily such that the observational conditions are reproduced well.

The above object is achieved by a specimen holder which is used with a transmission electron microscope and which comprises: a sheet for holding a thin specimen or a piece of mesh carrying a specimen; and an insertion rod having a gripping means at its front end, the gripping means being capable of detachably gripping one end of the specimen. The sheet and the rod are coupled together, so that the holder forms a unit.

Other objects and features of the invention will appear in the course of the description thereof which follows.

DETAILED DESCRIPTION OF THE INVENTION

Figure 1:
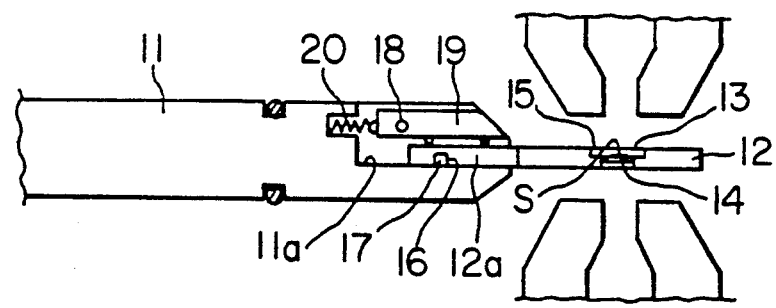
FIG. 1 is a side elevation of a specimen holder for a transmission electron microscope, the holder being fabricated in accordance with the invention.
Figure 2:
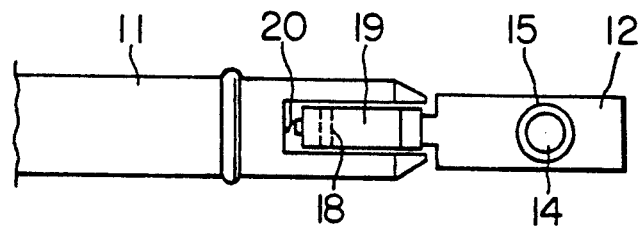
FIG. 2 is a plan view of the specimen holder shown in FIG. 1.

Referring to FIGS. 1 and 2, there is shown a specimen holder according to the invention, the holder being used with a transmission electron microscope. The specimen holder comprises a specimen-holding plate 12 and an insertion rod 11. The holding plate 12 is provided with a hole 13 close to its front end to permit passage of the electron beam produced in the microscope. The holding plate 12 is inserted between the magnetic pole pieces of the objective lens while retained at the front end 11a of the insertion rod 11. After the plate 12 has been inserted, it is not supported by the surroundings except for the insertion rod. A piece of mesh 14 on which a specimen S is placed is held within the hole 13 by a push-down screw 15. A receiving hole 16 is formed at the other end 12a of the holding plate 12 in the rear surface. A pin 17 fixedly mounted at the front end 11a of the insertion rod 11 fits into the receiving hole 16. The end 12a of the holding plate 12 is pressed against the front end 11a of the insertion rod by a hold-down 19 that is rotatably mounted to a shaft 18. Rotation of the hold-down 19 is limited by a spring 20 that is rigidly fixed to the insertion rod 11.

Figure 3:
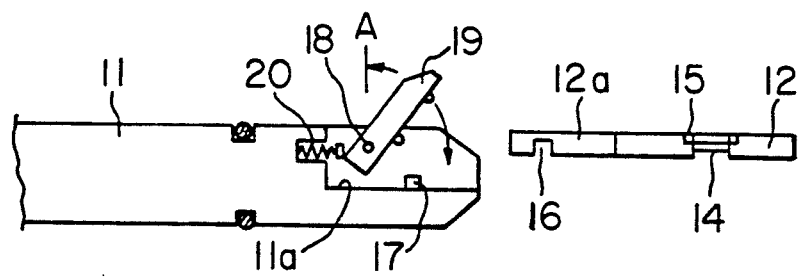
FIG. 3 is a view similar to FIG. 1, but in which the specimen-holding sheet of the holder is being detached.

When the specimen-holding plate 12 should be detached from the front end of the insertion rod 11, the end of the hold-down 19 to which the spring 20 is mounted is pushed downward, as shown in FIG. 3. Since the spring 20 is stretched or compressed according to movement of the hold-down 19, the front end of the hold-down 19 swings open. Under this condition, the specimen-holding plate 12 can be removed.

Figure 4:
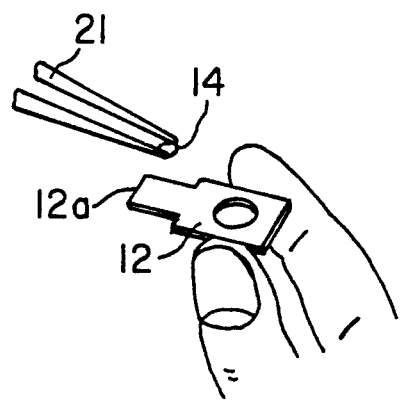
FIG. 4 is a view illustrating an operation for placing a specimen on the specimen-holding plate of the specimen holder shown in FIGS. 1-3.

In the conventional specimen holder, the insertion rod and the specimen-holding portion are integral. This holder is long and heavy. The holder is made stationary on a table or the like. A specimen gripped by a pair of tweezers is conveyed to the front end of the insertion rod and attached to it. On the other hand, in the novel specimen holder, the specimen-holding plate 12 detached from the front end 11a of the insertion rod 11 has a small area of about 1 to 2 cm². Because of this small size, the holding plate 12 is conveniently treated when held directly by one hand as shown in FIG. 4. Therefore, when the specimen gripped by the tweezers 21 of the mesh is conveyed into the electron beam passage hole 13 formed in the plate 12 and placed in position, the plate 12 can be moved or tilted at will. Consequently, specimens can be installed with greater ease than conventional. Furthermore, the detached plate 12 can be accommodated in a desiccator or other storage container while the specimen remains placed on the plate because the plate 12 is small.

Figure 5A:
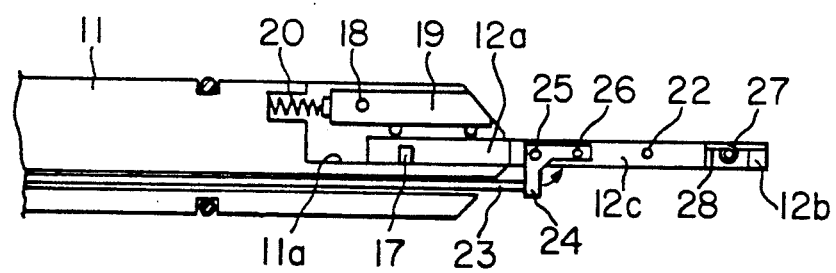
FIG. 5(a) is a side elevation of a specimen tilt mechanism mounted in the specimen holder shown in FIGS. 1-4 and a mechanism for driving the tilt mechanism.
Figure 5B:
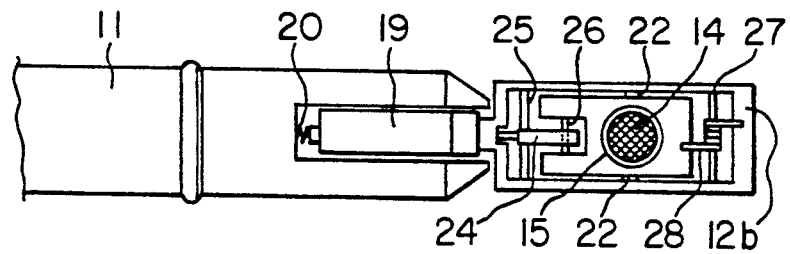
FIG. 5(b) is a plan view of the specimen tilt mechanism and the driving mechanism shown in FIG. 5(a)

FIGS. 5(a) and 5(b) show a specimen tilt mechanism incorporated in the specimen-holding plate 12 and a mechanism for driving the tilt mechanism. The holding plate 12 comprises a frame 12b made of a thin plate and a holder plate 12c. The holder plate 12c is mounted in the frame 12b via two spherical pivots 22 so as to be tiltable. The center of the electron beam passage hole 13 formed in the holder plate 12c is located on an inclined axis interconnecting the two pivots 22. A drive rod 23 is mounted inside the insertion rod 11. A lever 24 is mounted within the frame 12b. A shaft 25 is mounted to the frame 12b to hold the lever 24. Another shaft 26 engages with the lever 24 mounted to the holder plate 12c. A spring 28 is stretched between the frame 12b and the holder plate 12c to bias the sheet 12c in a clockwise direction at all times. A shaft 27 is mounted to the frame 12b and holds the spring 28.

Referring to FIG. 5(a), when the drive rod 23 is advanced to the right as viewed in the figure, the lever 24 held by the shaft 25 is rotated in a counterclockwise direction about the shaft 25 that is mounted to the frame 12b. Then, the lever bears against the shaft 26 and rotates the holder plate 12c about the spherical pivots 22 in a clockwise direction. As a result, the specimen placed in the center of the electron beam passage hole 13, or the axis interconnecting the two pivots 22 is tilted.

When this holder plate 12c should be detached from the front end 11a of the insertion rod 11, the hold-down 19 is rotated in the manner as described already in connection with FIGS. 1 and 2. Then, the frame 12b accommodating the holder plate 12c is pulled so that the drive rod 23 engaging the tilt mechanism inside the frame 12b may be left on the side of the insertion rod. In consequence, only the holder plate equipped with the tilt mechanism is detached.

Figures 6A, 6B:
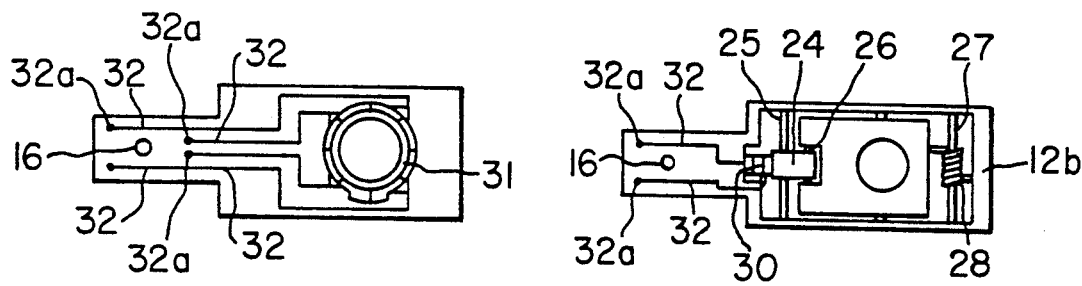
FIGS. 6(a) and 6(b) are plan views of other examples of specimen shift mechanisms mounted in the specimen-holding sheet shown in FIGS. 1-4.
Figure 7A:
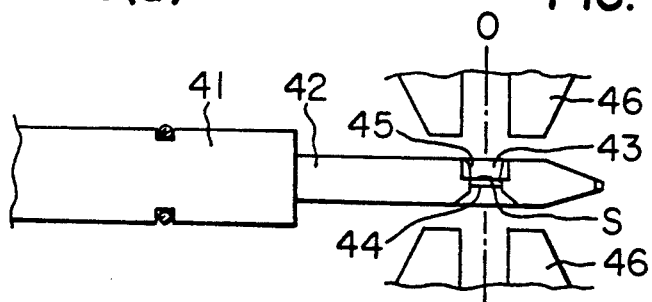
FIG. 7(a) is a side elevation of a conventional specimen holder.
Figure 7B:
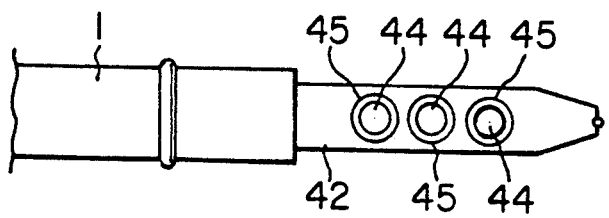
FIG. 7(b) is a plan view of the known specimen holder shown in FIG. 7(a)

FIGS. 6(a) and 6(b) show other examples of the specimen shift mechanism incorporated in the holder plate. These figures are taken from the rear side of the holder plate. The mechanism shown in FIG. 6(b) is similar to the specimen tilt mechanism shown in FIG. 5 except that the drive rod 23 for driving the lever 24 is replaced by an electrostrictive device 30 disposed between the frame 12b and the lever 24. A voltage is applied to this device 30 to stretch or compress it for rotating the lever. In this way, the specimen is tilted.

In the mechanism of FIG. 6(a), a mechanism 31 that rotates within a plane comprises an electrostrictive device. For example, this rotating mechanism consists of a walker making use of an ultrasonic motor or piezoelectric device. Interconnects 32 are printed at the end 12a of the holder sheet. Voltages for driving the devices shown in FIGS. 6(a) and 6(b) and signals for controlling the devices are supplied through these interconnects 32. The ends 32a of the interconnects 32 are connected with the ends of feed lines at the boundary surface with the end 11a of the insertion rod 11, the feed lines extending through the rod.

Figure 8A:
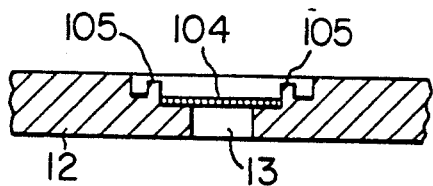
FIGS. 8(a) to 8(d), are cross-sectional views of a structure for securing either a specimen or a piece of mesh carrying a specimen to the specimen holder shown in FIGS. 1-4.
Figure 8B:
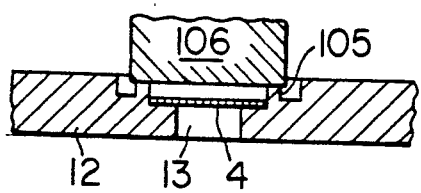
Figure 8C:
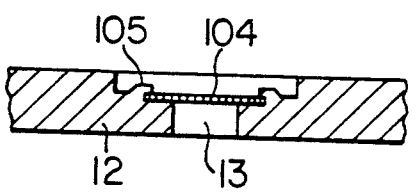
Figure 8D:
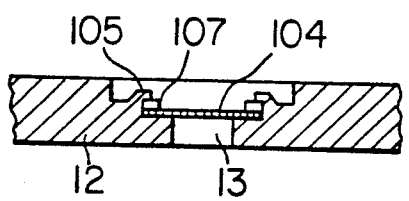

FIGS. 8(a) to 8(d) show structures for securing either a specimen or a piece of mesh on which a specimen is held to the specimen-holding plate 12. The upper portion of the hole 13 permitting passage of the electron beam is made larger in diameter than the lower portion and thus a step is formed. As shown in FIG. 8(a) a piece of mesh 104 is placed on this step. Claws 105 are formed around the mesh 104. A jig 106 is pressed against the claws 105 so as to crush them as shown in FIG. 8(b). Then, as shown in FIG. 8(c), the mesh 104 is crimped against the holding plate 12 by the claws 105. As shown in FIG. 8(d), a ring 107 may be interposed between the set of claws 105 and the mesh 104. The claws 105 may surround the whole outer periphery of the mesh 104. Also, the claws 105 may be composed of several parts which are spaced from each other around the mesh.

Figure 9A:
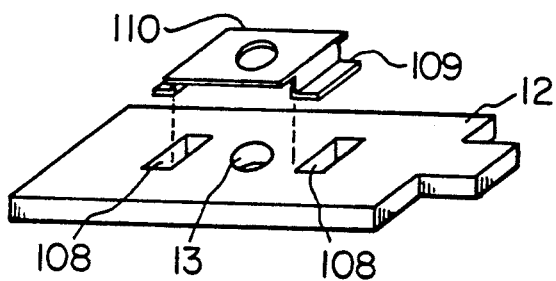
FIGS. 9(a) to 9(d) are cross-sectional views of another structure for securing either a specimen or a piece of mesh carrying a specimen to the specimen holder shown in FIGS. 1-4.

FIGS. 9(a) to 9(d) show other structures for securing either a specimen or a piece of mesh on which a specimen is held to the specimen-holding plate 12. In these examples, as shown in FIG. 9(a), a pair of claws 109 and a cover 110 are used to hold a specimen. The cover 110 is provided with a hole which registers with the hole 13 permitting passage of the electron beam. For instance, the cover 110 is made of a sheet about 0.2 mm thick. The holding plate 12 is formed with a pair of rectangular holes 108 on opposite sides of the beam passage hole 13. The claws 109 are engaged in the rectangular holes 108 to hold the mesh 104 between the cover 110 and the holding plate 12.

Figure 9B:
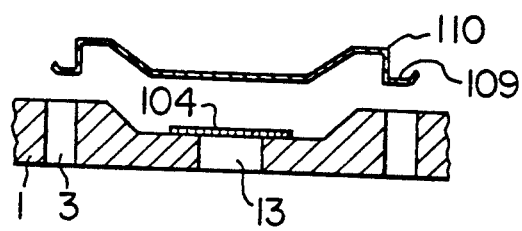
Figure 9C:
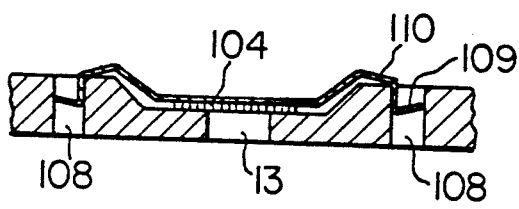

FIGS. 9(b) and 9(c) show an example in which the upper portion of the electron beam passage hole 13 is made larger in diameter than the lower portion. The profile of the hole in the cover 110 is shaped in conformity with the profile of the passage hole 13.

Figure 9D:
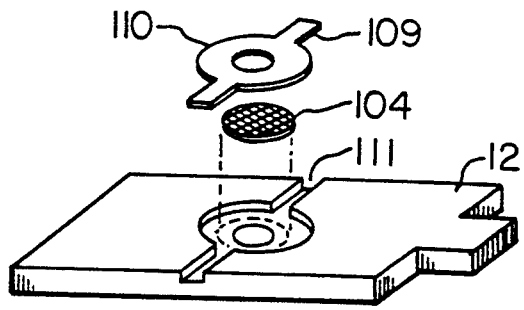

In the structure of FIG. 9(d), the cover 110 takes an annular form. A pair of claws 109 is formed on the outer periphery of this cover. A groove 111 which conforms in shape with the cover 110 is formed on the surface of the specimen-holding plate 12 around the electron beam passage hole 13. The mesh can be held by inserting it into the center of the groove 111 and then pressing the cover 110 into the groove 111 together with the underlying mesh.

While preferred embodiments of the invention have been described, variations thereto will occur to those skilled in the art within the scope of the present invention. For example, in the above embodiments the specimen shift mechanism which is mechanically connected with the drive rod disposed on the side of the insertion rod when the frame is mounted to the insertion rod is a specimen tilt mechanism. The specimen shift mechanism may also be a mechanism rotating within a plane. In addition, plural shift mechanisms may be provided.

Where plural shift mechanisms are provided in the frame, a plurality of drive rods are incorporated in the insertion rod. The specimen shift mechanisms in the frame are designed to be capable of engaging any desired drive mechanism. In this case, it is necessary that the plural drive rods be provided in the insertion rod. However, the specimen can be moved in various manners by selecting various specimen-holding sheets for one insertion rod. Therefore, it is not necessary to prepare plural expensive specimen holders, which is economically advantageous. Also, similar advantages can be obtained where interconnects printed on the frame are connected with the ends of the feed lines which are brought out at the front end of the insertion rod to electrically activate the electrostrictive device or the like.

As can be seen from the description made thus far, the novel specimen holder for a transmission electron microscope comprises a specimen-holding member and an insertion rod. The holding member is provided with a hole permitting passage of the electron beam produced by the microscope. A thin specimen or a piece of mesh on which a specimen is placed is held inside this hole. The holding member has an engaging portion at its one end. The insertion rod has a connecting mechanism at its front end. The connecting mechanism engages the engaging portion of the holding member and detachably holds the holding member. Since the holding member and the insertion rod are coupled together by the connecting mechanism, the specimen can be replaced without the need to take the specimen out of the holder plate. Therefore, the specimen can be easily replaced. Furthermore, the azimuth angle of the specimen, or the angular position of the specimen, can be reproduced well on a second installation of the specimen. The holder plate is small enough to be easily handled by one hand and so the holder plate can be moved and tilted at will if the specimen or the mesh gripped by a pair of tweezers or the like is carried into the electron beam passage hole in the holder sheet and placed in position. Consequently, the specimen can be placed in position with greater ease than conventional.

Further, the novel specimen holder needs only one specimen insertion rod, irrespective of the presence or absence of shift mechanisms. Only a small holder plate carrying a specimen is replaced. Hence, the cost of the instrument can be lowered as compared with the case in which plural specimen holders are prepared.

Having thus described our invention with the detail and particularity required by the Patent Laws, what is desired and claimed to be protected by Letters Patent is set forth in the following claims.

What is claimed is:

1. A specimen holder for a transmission electron microscope, comprising:
   a specimen-holding member provided with a hole permitting passage of an electron beam produced inside the electron microscope, said hole being adapted to hold a thin specimen;
   an engaging portion formed at one end of said specimen-holding member;
   an insertion rod;
   a connecting means mounted at a front end of said insertion rod for releasably connecting said specimen-holding member to said insertion rod by engaging with said engaging portion of said specimen-holding member, wherein said connecting means detachably holds said specimen-holding member to said insertion rod such that said specimen holder forms a unit;
   wherein there is further provided a thin securing cover having claws which are engaged in notches formed in said specimen-holding member to hold the specimen between said cover and said specimen-holding member.

2. A specimen holder for a transmission electron microscope, comprising:
   a specimen-holding member provided with a hole permitting passage of an electron beam produced inside the electron microscope, said hole being adapted to hold a thin specimen;
   an engaging portion formed at one end of said specimen-holding member;
   an insertion rod;
   a connecting means mounted at a front end of said insertion rod for releasably connecting said specimen-holding member to said insertion rod by engaging with said engaging portion of said specimen-holding member;
   wherein said connecting mechanism includes a specimen-holding member receiving surface formed at said front end of said insertion rod and a hold-down member being pivotally mounted on said insertion rod and cooperating with said receiving surface to hold said specimen-holding member therebetween, and a resilient member applying a force to said hold-down member in such a direction that said specimen-holding member is pressed toward said receiving surface by said hold-down member, and wherein said connecting means detachably holds said specimen-holding member to said insertion rod and said insertion rod is disconnected from said specimen-holding member by pivoting said hold-down member against the force of said resilient member.

3. The specimen holder of claim 2, further including a specimen shift mechanism mounted to said specimen-holding member; and a drive shaft which acts to apply a driving force to said specimen shift mechanism and extends through said insertion rod and which, when said specimen-holding member is mechanically connected to said insertion rod by said connecting mechanism, engages said specimen shift mechanism and can transmit a driving force to said shift mechanism.

4. The specimen holder of claim 2, further including an electrically activated specimen shift mechanism mounted to said specimen-holding member; feed lines extending through said insertion rod for supplying driving electric power to said specimen shift mechanism; and a means which, when said insertion rod is mechanically connected to said specimen-holding member by said connecting mechanism, electrically connects said feed lines with said specimen shift mechanism.

5. The specimen holder of claim 2, further comprising a piece of mesh on which the specimen may be placed, said piece of mesh being positioned over the hole in the specimen-holding member.

6. The specimen holder of claim 2, wherein there is further provided a thin securing cover having claws which are engaged in notches formed in said specimen-holding member, to hold a piece of mesh carrying the specimen between said cover and said specimen-holding member.

7. A specimen holder for a transmission electron microscope, comprising:
- a specimen-holding member provided with a hole permitting passage of an electron beam produced inside the electron microscope, said hole being adapted to hold a thin specimen;
- an engaging portion formed at one end of said specimen-holding member;
- an insertion rod;
- a connecting means mounted at a front end of said insertion rod for releasably connecting said specimen-holding member to said insertion rod by engaging with said engaging portion of said specimen-holding member; and
- a specimen-securing means for securing a specimen to said specimen-holding member, said specimen-securing means including claws which are deformed to secure the specimen.

8. The specimen holder of claim 7, wherein said claws are crimped to be crushed to secure the specimen to said specimen-holding member.

9. The specimen holder of claim 7, wherein said claws are crimped to be crushed to secure a piece of mesh carrying the specimen to said specimen-holding member.

* * * * *